United States Patent [19]

Cho et al.

[11] Patent Number: 5,420,472
[45] Date of Patent: May 30, 1995

[54] METHOD AND APPARATUS FOR THERMAL COEFFICIENT OF EXPANSION MATCHED SUBSTRATE ATTACHMENT

[75] Inventors: Frederick Y. Cho, Scottsdale; David Penunuri, Fountain Hills, both of Ariz.

[73] Assignee: Motorola, Inc., Schaumburg, Ill.

[21] Appl. No.: 182,524

[22] Filed: Jan. 18, 1994

Related U.S. Application Data

[63] Continuation of Ser. No. 897,123, Jun. 11, 1992.

[51] Int. Cl.$^6$ .......................................... H01L 41/08
[52] U.S. Cl. .................................. 310/344; 310/313 R
[58] Field of Search ............... 310/344, 346, 348, 360, 310/361, 313 R, 313 A

[56] References Cited

U.S. PATENT DOCUMENTS

| | | | |
|---|---|---|---|
| 3,644,761 | 2/1972 | Doi et al. | 310/360 |
| 3,943,389 | 3/1976 | Hickernell et al. | 310/9.5 |
| 3,970,880 | 7/1976 | Deutschmann et al. | 310/344 |
| 4,034,318 | 7/1977 | Ishiyama et al. | 310/313 R |
| 4,035,673 | 7/1977 | Ishida et al. | 310/344 X |
| 4,191,905 | 3/1980 | Yasuda et al. | 310/344 |
| 4,350,918 | 9/1982 | Sato | 310/344 X |
| 4,472,652 | 9/1984 | Brice et al. | 310/344 X |
| 4,511,821 | 4/1985 | Nakamura et al. | 310/344 X |
| 4,542,315 | 9/1985 | Yamamoto et al. | 310/344 X |
| 4,586,350 | 5/1986 | Berdahl | 62/467 |
| 4,639,631 | 1/1987 | Cheson et al. | 310/344 |
| 4,750,800 | 6/1988 | Fournier et al. | 350/96.11 |
| 4,871,226 | 10/1989 | Courtney et al. | 350/96.17 |
| 4,992,398 | 2/1991 | Huang et al. | 501/135 |
| 5,019,306 | 5/1991 | Huang et al. | 264/66 |
| 5,149,590 | 9/1992 | Arthur et al. | 428/421 |
| 5,208,504 | 5/1993 | Parker et al. | 310/313 R |
| 5,222,293 | 6/1993 | Ozimek met al. | 29/833 |
| 5,224,972 | 7/1993 | Frye et al. | 55/18 |
| 5,235,235 | 8/1993 | Martin et al. | 310/313 D |
| 5,237,235 | 8/1993 | Cho et al. | 310/313 R |
| 5,303,457 | 4/1994 | Falkner et al. | 29/25.35 |

FOREIGN PATENT DOCUMENTS

| | | | |
|---|---|---|---|
| 52-2019045 | 2/1977 | Japan | 310/313 R |
| 49013 | 4/1980 | Japan | 310/344 |
| 30412 | 2/1987 | Japan | 310/344 |
| 52-2245712 | 10/1987 | Japan | 310/313 R |
| 4-040705 | 2/1992 | Japan | 310/313 A |
| 5-251982 | 9/1993 | Japan | 310/313 A |
| 2067009 | 7/1981 | United Kingdom | 310/344 |

OTHER PUBLICATIONS

An article entitled "The Temperature Coefficients of Acoustic Surface Wave Velocity and Delay on Lithium Niobate, Lithium Tantalate, Quartz, and Tellurium Dioxide," by A. J. Slobodnick, Jr., AFCRL-72-0082, 22 Dec. 1972, available from DTIC, pp. 9-11.

*Primary Examiner*—Thomas M. Dougherty
*Attorney, Agent, or Firm*—Frederick M. Fliegel

[57] ABSTRACT

A radio frequency apparatus desirably includes at least one microelectronic device comprising a substrate including the at least one microelectronic device and a package base for mounting the microelectronic device. The package base includes external interconnections coupled to internal interconnections and an adhesive affixing the substrate to the package base. The adhesive is disposed along a first axis of the substrate. The internal interconnections are coupled to the microelectronic device. A lid is sealed to the package base. The lid seals the microelectronic device.

20 Claims, 6 Drawing Sheets

METHOD AND APPARATUS FOR THERMAL COEFFICIENT OF EXPANSION MATCHED SUBSTRATE ATTACHMENT

This application is a continuation of prior application Ser. No. 07/897,123, filed Jun. 11, 1992.

FIELD OF THE INVENTION

This invention relates in general to the field of microelectronic devices in particular to packaging such devices and employing substrata having anisotropic expansion coefficients.

BACKGROUND OF THE INVENTION

Substrata having anisotropic thermal expansion properties are important for many electronic products incorporating microelectronic components or devices. Typically, microelectronic components including a substrate are contained in a package for ease of use and for protection from damage which might occur, for example, during shipping, testing and/or during installation. Often it is desirable to affix a microelectronic component to a package base by means of an adhesive, such as solder or some form of glue. Materials employed in the art include room temperature vulcanizing silicone rubbers, epoxies, thermoplastic materials and other organic, inorganic and quasiorganic substances. Package bases comprise materials having isotropic thermal expansion properties (e.g., metals, ceramics) or anisotropic thermal expansion properties (e.g., woven laminated materials).

Problems often encountered due to differences in thermal expansion coefficients between substrates and package bases include de-lamination of the substrate from the package base and fracture of the substrate and/or package base. A further problem is encountered in stress-induced distortion of device responses because of temperature changes and differences in temperature coefficients of expansion. These problems are exacerbated when the substrate has anisotropic thermal expansion properties and the package base has isotropic thermal expansion properties or anisotropic properties differing from those of the substrate.

One approach to avoiding fracture of the substrate and/or package base is to employ a relatively soft adhesive layer. This often renders the device susceptible to de-lamination and may also result in unacceptable stresses within the substrate when the packaged device is thermally cycled.

What are needed are methods and apparatus for substrate attachment which provide reduced thermal-induced stresses and robust bonding for substrates having anisotropic thermal expansion characteristics.

SUMMARY OF THE INVENTION

Accordingly, there is provided a new and improved apparatus comprising a substrate, the substrate including a microelectronic device, and a package base. The microelectronic device is mounted on the package base. The package base includes external interconnections coupled to internal interconnections. An adhesive affixes the substrate to the package base. The adhesive is disposed along a first axis of the substrate. The internal interconnections are coupled to the microelectronic device. The apparatus includes a lid. The lid is sealed to the package base.

A radio frequency apparatus includes at least one microelectronic device comprising a substrate including at least one microelectronic device and a package base for mounting the microelectronic device. The package base includes external interconnections coupled to internal interconnections and an adhesive affixing the substrate to the package base. The adhesive is disposed along a first axis of the substrate. The internal interconnections are coupled to the microelectronic device. A lid is sealed to the package base. The lid seals the microelectronic device.

The present invention further provides a method for packaging a substrate. The substrate has anisotropic thermal expansion properties. The method comprises steps of providing the substrate including an electronic device and providing a package base. The package base includes external interconnections coupled to internal interconnections. The method further comprises steps of affixing the substrate to the package base with an oriented adhesive material, coupling the internal interconnections to the electronic device and sealing a lid to the package base.

The method desirably but not essentially includes the step of providing a substrate comprising a member of the group consisting of silicon dioxide, lithium niobate and lithium tantalate.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWINGS

Figure 1:
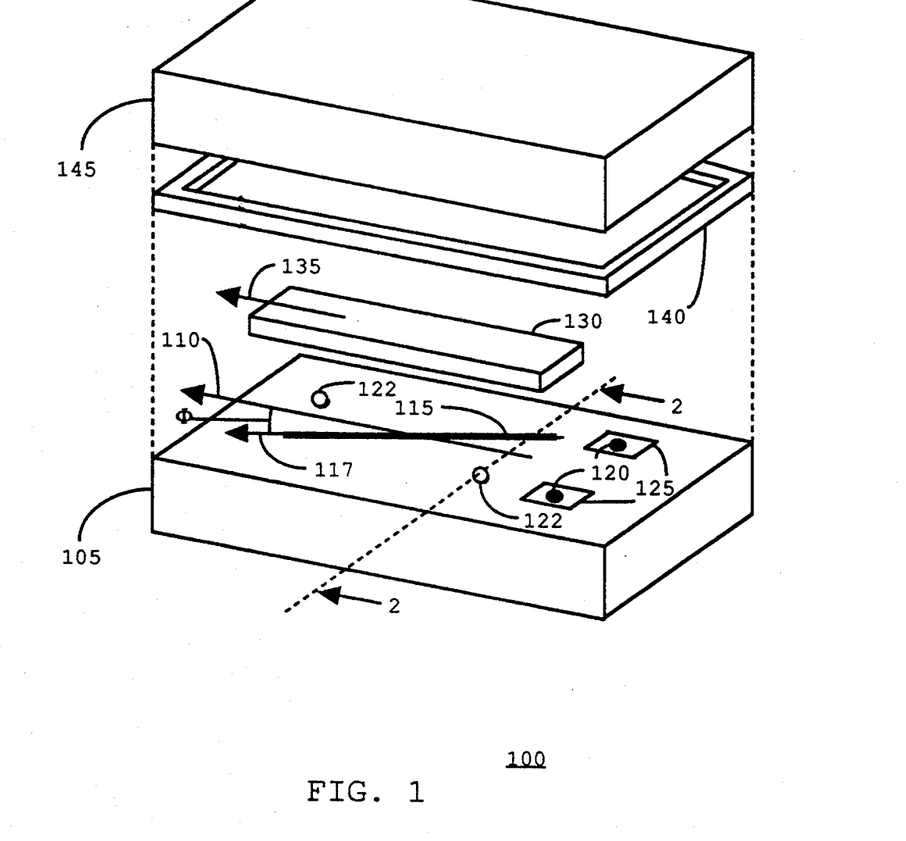
FIG. 1 is a simplified isometric view of a package base, a microelectronic device and a package lid in accordance with a preferred embodiment of the present invention.

FIG. 1 is a simplified isometric view of package base 105, microelectronic device 130 and package lid 145 in accordance with a preferred embodiment of the present invention. Microelectronic device package 100 comprises package base 105 and adhesive 115 oriented along direction 117 at an angle Φ with respect to direction 110. Package base 105 includes optional substrate supports 122. Microelectronic device package 100 also includes interconnections 125 for providing externally accessible connections (not shown) through metal-filled vias 120. Microelectronic device package 100 includes microelectronic device 130 having a preferred direction 135. Microelectronic device package 100 also includes lid 145 and seal 140.

Adhesive 115 may be any of a broad variety of adhesive types, including organic polymers such as epoxy, urethane, cyanoacrylates, acrylics, polyamides, polyimides, polyolefins or quasi-organic materials including silicone rubbers such as room temperature vulcanizing silicone rubbers, polysulfide polymers and other polymeric adhesives manufactured by a variety of companies and distributed, for example, by K. R. Anderson Co., Inc., of Phoenix, Ariz. Thermoplastic plastic materials are of particular interest because they provide strong bonds, produce little or no outgassed material during temperature treatment and have relatively low melting points. Companies providing such materials include Staystick, Inc., of Santa Ana, Calif., which markets thermoplastic die attachment materials as a paste for screen printing as STAYFORM TM adhesive 1XY, which are pastes forming conductive die attachments containing gold and silver, STAYFORM TM adhesive 2XY, containing aluminum nitride, and STAYFORM TM adhesive 3XY, which forms insulating die attachment films, and as a film as STAYFORM TM adhesive 5XY, 6XY and 4XY, having properties similar to those of the pastes, respectively, where X and Y represent integers, E. I. DuPont Nemours of Towanda, Pa., which markets preforms of films as Q 34XY, 35XY and 36XY and A. I. Technology, Inc., of Princeton, N.J., which produces thermoplastic films (Type TP7XYZ and TP8XYZ) and pastes (Type LTP7XYZ and LTP8XYZ) for die attachment. Some representative examples of thermoplastic polymers and suitable bonding temperatures are summarized in Table I below.

TABLE I
BONDING TEMPERATURES FOR SEVERAL THERMOPLASTIC MATERIALS

| MATERIAL | BONDING TEMPERATURE (°C.) |
| --- | --- |
| Polyetheretherketone | 360 |
| Polysulfone | 300–380 |
| Polyethersulfone | 320–380 |
| Polyetherimide | 340–380 |
| Polybutlyeneterepthalate | 240 |
| Polycarbonate | 230–290 |

Alternatively, adhesive 115 may comprise solders such as In and In alloys or other solders as are known in the relevant arts. Solders generally require metallized regions on package base 105 and substrate 130, deposited, for example, by RF sputtering or by vacuum evaporation and comprising metals which adhere well to substrate 105 and/or to substrate 130 and which are wettable by solders employed as adhesive 115.

Package base 105 comprises any of a variety of ceramic materials such as ceramics manufactured from 99.2% or 99.6% pure alumina, available from a variety of vendors including Kyocera America of San Diego, Calif., ceramics comprising strontium calcium titanate (also referred to hereinbelow as Sr—Ca—Ti ceramics) of varying compositions available from Motorola Ceramic Products Division of Albuquerque, N. Mex. and described in U.S. Pat. Nos. 4,992,398 and 5,019,306, entitled "High Frequency Dielectric Composition", by R. F. Huang and which are incorporated herein by reference, or numerous types of materials often employed in circuit boards such as glass fiber composites, polyimide materials, fluorocarbon materials and the like which are well known in the relevant arts. Optional substrate supports 122 and adhesive 115 support microelectronic device 130 when microelectronic device 130 is attached to package base 105 by adhesive 115.

Microelectronic device 130 comprises materials having anisotropic temperature coefficients of expansion. Package base 105 comprises materials having isotropic or anisotropic temperature coefficients of expansion.

Microelectronic device 130 and package base 105 are chosen to have similar values of temperature coefficient of expansion along some particular direction such as 117 when axis 135 of microelectronic device 130 is aligned to direction 110 of package base 105. Microelectronic device 130 can then be affixed to package base 105 by adhesive 115. Adhesive 115 is placed along a narrow area lying substantially along a preferred direction such as direction 117 while minimizing thermally-induced stresses within adhesive 115, package base 105 and microelectronic device 130.

Examples of microelectronic devices such as 130 comprising materials having anisotropic temperature coefficients of expansion include nonlinear and/or linear integrated or monolithic optical devices (interferometers, frequency doublers, splitters/combiners, acousto-optical devices, etc.), acoustic devices (i.e., convolvers, filters, impedance elements, etc.) and other microelectronic apparatus wherein a special material property is needed.

Interconnections 125 effect electrical interconnection from external apparatus (not shown) to microelectronic device 130 via wirebonds (not shown), welded ribbons (not shown) to one or more devices attached to package base 105 and/or which terminate in externally accessible pins, solder bumps, wires, etc. (not shown) as are well known in the microelectronic arts.

Interconnections 125 may alternatively comprise, for example, optical interconnections such as fiber-optical interconnections or optical windows such as are employed with ultraviolet-erasable read only memories, as are well known in the art.

Package lid 145 is secured to package base 105 by seal 140 after microelectronic device 130 has been attached to package base 105. Seal 140 comprises adhesives such as epoxy, thermoplastic materials, glasses such as, by way of example, low-melting temperature glasses including mixtures containing PbO-V$_2$O$_5$ (such as that available from VLSI of Sunnyvale, Calif.), metals such as solders comprising alloys of gold, silver, tin, lead, copper, etc., or may be a seal effected between a metallic lid and a metallic base by processes such as seam welding, for example, as are well known in the art. Seal 140 may effect a hermetic seal, for example.

Figure 2:
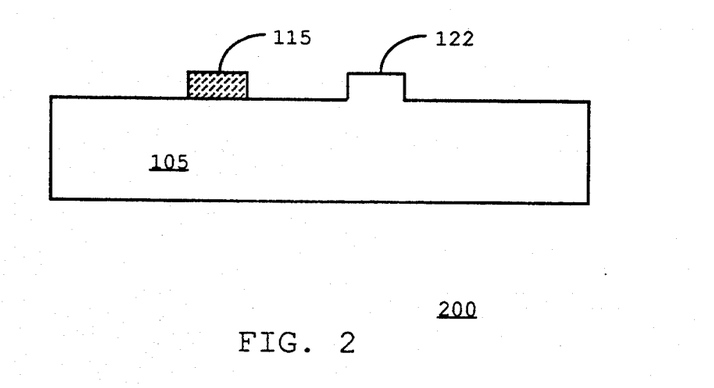
FIG. 2 is a simplified and enlarged side view, in section, taken along section lines 2—2 of FIG. 1, of the package base in accordance with the present invention.

FIG. 2 is a simplified and enlarged side view, in section, taken along section lines 2—2 of FIG. 1, of package base 105 in accordance with the present invention. FIG. 2 illustrates package base 105, adhesive 115 and optional substrate supports 122. Optional substrate supports 122 and adhesive 115 are of approximately the same height above a top surface of package base 105 after microelectronic device 130 has been attached thereto.

Figure 3:
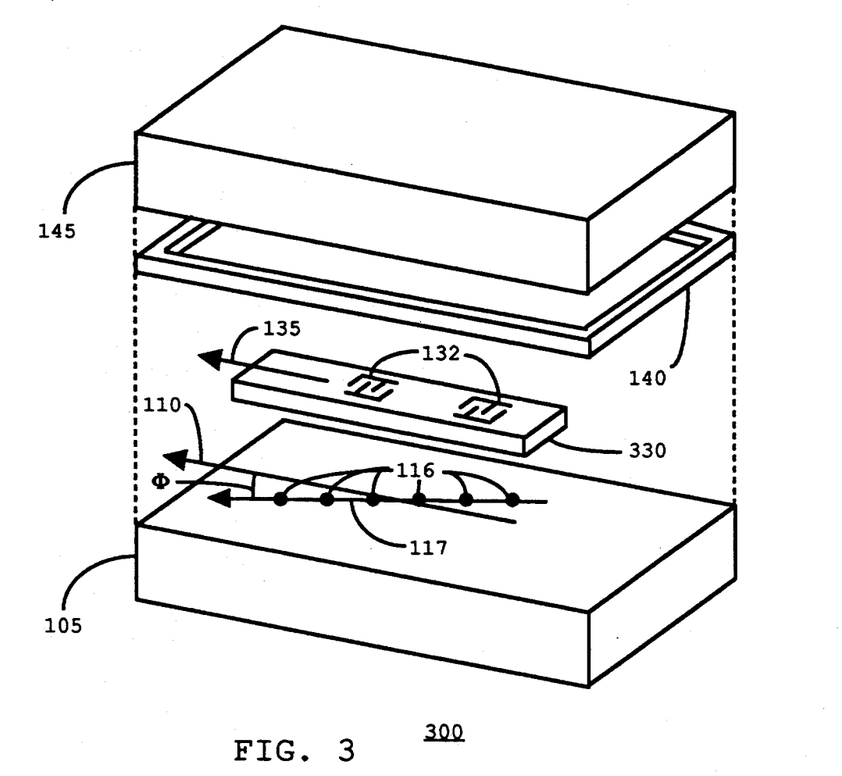
FIG. 3 is a simplified isometric view of a package base, a microelectronic device and a package lid in accordance with another embodiment of the present invention.

FIG. 3 is a simplified isometric view of package base 105, surface acoustic wave (SAW) device 330 and package lid 145 in accordance with another embodiment of the present invention. Package base 105 includes adhesive dots 116 disposed along a direction 117 at an angle Φ with respect to direction 110.

SAW device 330 has interdigital transducers 132 disposed on a surface thereof which transducers are coupled to external electronic apparatus (not shown) as described hereinabove.

SAW device 330 and package base 105 are chosen to have matched values of temperature coefficient of expansion along some particular direction such as 117 when axis 135 of SAW device 330 is aligned to direction 110 of package base 105. SAW device 330 can then be affixed to package base 105 by adhesive 115 placed along a narrow area lying substantially along direction 117 while minimizing thermally-induced stresses within adhesive 115, package base 105 and SAW device 330.

Figure 4:
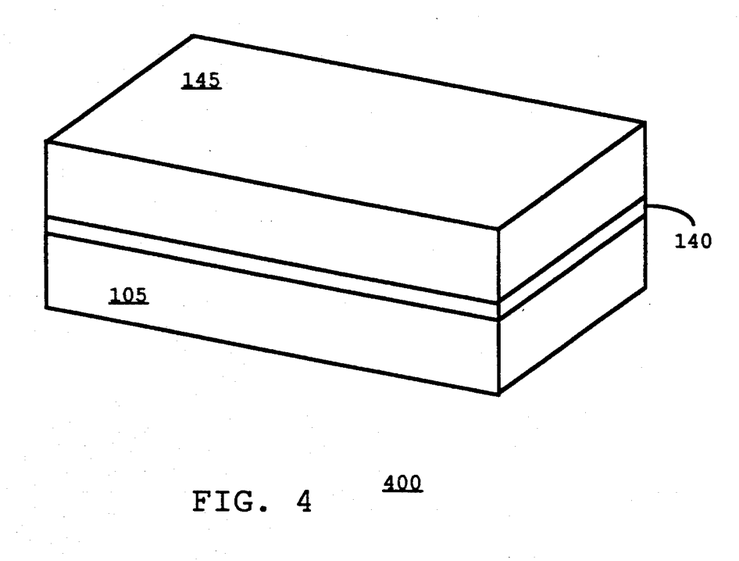
FIG. 4 is an isometric view of a packaged microelectronic device in accordance with the present invention.

FIG. 4 is an isometric view of packaged microelectronic device 400 in accordance with the present invention. Packaged microelectronic device 400 comprises package base 105, lid 145 and seal 140. Packaged microelectronic device 400 further includes a microelectronic device, adhesive and ancillary interconnections (not shown in FIG. 4).

Figure 5:
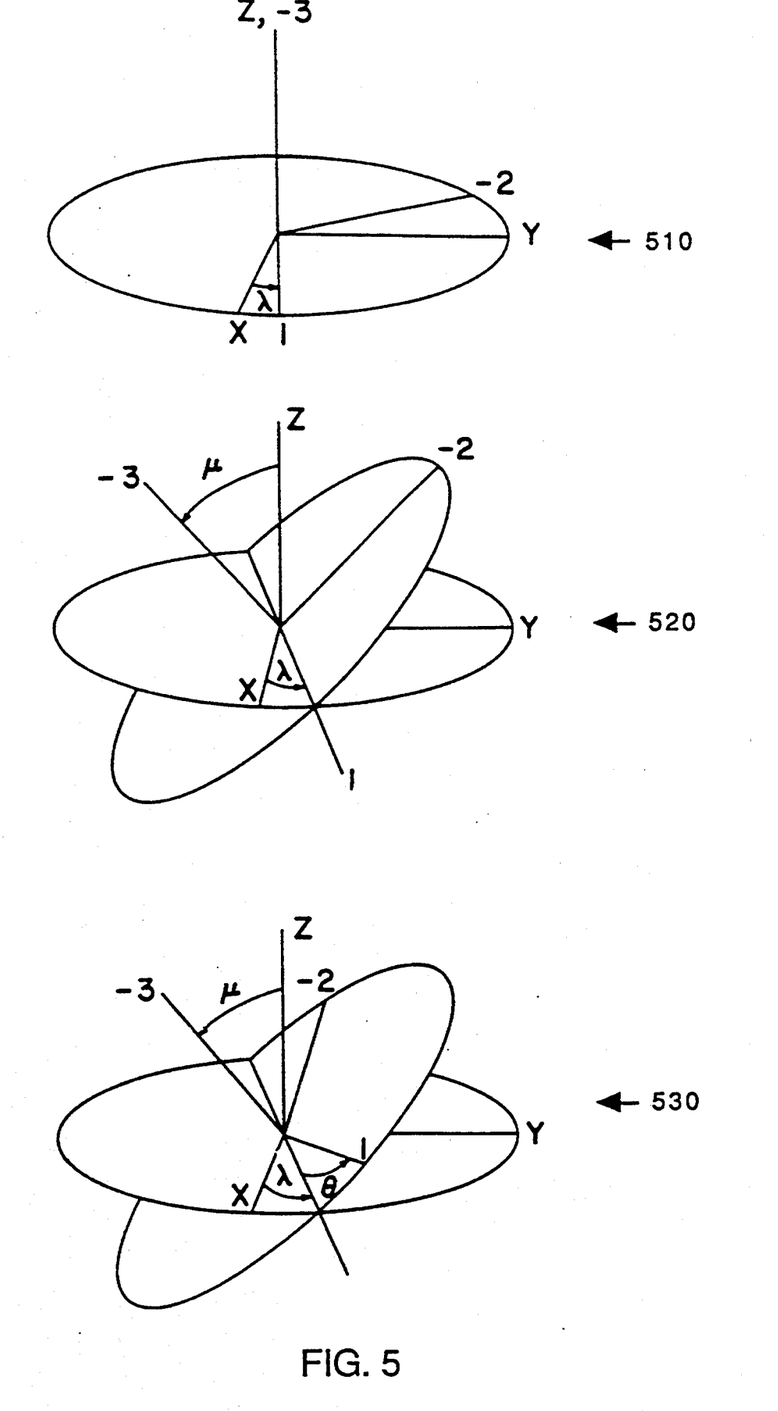
FIG. 5 illustrates relationships between initial coordinates, Euler angles and final coordinates.

FIG. 5 illustrates relationships between crystallographic axes X, Y and Z, propagation axes 1, 2 and 3 and Euler angles λ, μ and Φ. The arrangement described in FIG. 5 is in accordance with "The Temperature Coefficients of Acoustic Surface Wave Velocity and Delay on Lithium Niobate, Lithium Tantalate, Quartz, and Tellurium Dioxide," by A. J. Slobodnick, Jr., AFCRL-72-0082, available from DTIC.

Top portion 510 of FIG. 5 shows a representative example of an initial rotation of axes 1, 2 and 3 with respect to crystallographic axes X, Y, and Z by an angle λ about the Z or 3 axis to provide new 1 and 2 axes. Prior to the initial rotation, X, Y and Z correspond to 1, 2 and 3, respectively. The initial rotation corresponds to:

$$[R1] = \begin{bmatrix} \cos\lambda & \sin\lambda & 0 \\ -\sin\lambda & \cos\lambda & 0 \\ 0 & 0 & 1 \end{bmatrix}. \quad (1)$$

Middle portion 520 of FIG. 5 shows a representative example of a second rotation of new axes 1, 2 and 3 by an angle μ about the new 1 axis to provide revised 1, 2 and 3 axes. The second rotation corresponds to:

$$[R2] = \begin{bmatrix} 1 & 0 & 0 \\ 0 & \cos\mu & \sin\mu \\ 0 & -\sin\mu & \cos\mu \end{bmatrix}. \quad (2)$$

Bottom portion 530 shows a representative example of a third rotation of revised axes 1, 2 and 3 by an angle Φ about the revised 3 axis to provide propagation axes 1, 2 and 3. The third rotation corresponds to:

$$[R3] = \begin{bmatrix} \cos\theta & \sin\theta & 0 \\ -\sin\theta & \cos\theta & 0 \\ 0 & 0 & 1 \end{bmatrix}. \quad (3)$$

The three rotations are mathematically combined to provide material constants [C] corresponding to the rotated material:

$$[C] = [[R3][R2][R1][K][[R3][R2][R1]]^T], \quad (4)$$

where [K] represents the initial material constants for the crystallographic orientation An Euler angle transformation thus allows the physical properties [C] of an arbitrary orientation of an anisotropic material to be described by three rotation angles λ, μ and Φ and the material properties [K] referenced to crystallographic axes X, Y and Z. This allows the physical properties of an arbitrary orientation of an anisotropic material to be described by simple mathematical transformation of a tensor describing the constants quantifying the relevant material properties.

The first order thermal expansion coefficients [K] of several substrate and package base materials are given below in TABLE II:

TABLE II

| Material | K11 | K22 | K33 |
|---|---|---|---|
| Quartz | 7.4 | 7.4 | 13.6 |
| LiNbO$_3$ | 15 | 15 | 7.5 |
| LiTaO$_3$ | 16.1 | 16.1 | 4.1 |
| Al$_2$O$_3$ (99.2%) | 6.5 | * | * |
| Al$_2$O$_3$ (99.6%) | 6.7 | * | * |
| Sr—Ca—Ti ceramics | 9–13 | * | * |
| epoxy/glass | 12–17 | * | * |
| polyimide/glass | 12–15 | * | * |
| epoxy/quartz | 8–12 | * | * |
| polyimide/quartz | 8–11 | * | * |
| epoxy/aramid | 6.5–11 | * | * |
| polyimide/aramid | 6–10 | * | * |
| GaAs | 6 | * | * |
| Corning Type 7052 glass | 5 | * | * |
| Kovar | 5 | * | * |

First order thermal expansion coefficients for a variety of materials (in parts per million per degree Celsius).
wherein a * indicates that the thermal coefficient of expansion is isotropic (e.g., K$_{ii}$ = K$_{jj}$).

FIGS. 6 through 10 provide five examples of thermal expansion coefficients versus angle in a particular plane which includes a known axis for five useful orientations of anisotropic substrate materials. The ordinates are all calibrated in parts per million per degree Celsius while the abscissae are all calibrated in angular degrees in the plane from the particular crystallographic axis.

Example I

Figure 6:
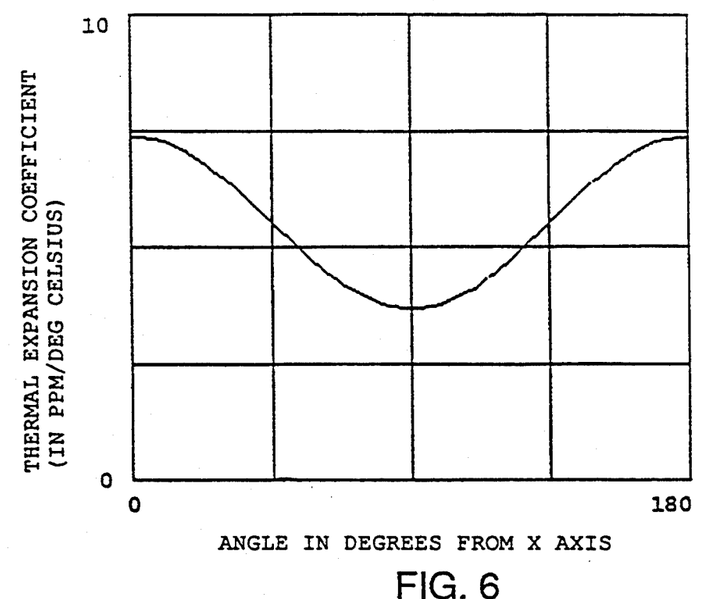
FIG. 6 is a graph of the thermal coefficient of expansion versus angle from the X axis in the ST plane of a quartz crystal.

FIG. 6 is a graph of the thermal coefficient of expansion versus angle Φ from the X axis in the ST plane of a quartz (silicon dioxide) crystal. The data of FIG. 6 are obtained by applying Eq. (4) to the thermal expansion coefficients (TABLE II) of silicon dioxide (quartz) using Euler angles 0, 132.75° and θ. Angle θ here describes an angle between a direction in which thermal expansion coefficients are being computed and the crystallographic X axis.

ST-cut quartz includes quartz cut at angles other than 132.75° = μ, generally within plus or minus fifteen degrees and preferably within plus or minus seven degrees. These different angles $\mu$ are employed to provide quartz substrata having temperature coefficients of delay tailored to a particular application.

Thermal coefficients of expansion are approximately matched between ST-cut quartz and $Al_2O_3$-based ceramics (e.g., alumina) for angles $\Phi$ (see FIGS. 1 and 3) in the range of 0° to 10°, depending on the precise composition and purity of the $Al_2O_3$-based ceramic employed (see TABLE I).

Similar angles reduce thermal coefficient of expansion mismatch between quartz and epoxy/glass, epoxy/quartz, polyimide/glass/polyimide/quartz, epoxy/aramid and polyimide/aramid package base materials.

Thermal coefficients of expansion are approximately matched between ST-cut quartz and KOVAR ™ metal or Type 7052 glass at angles $\Phi$ of nominally about 50° and 140°.

Example II

Figure 7:
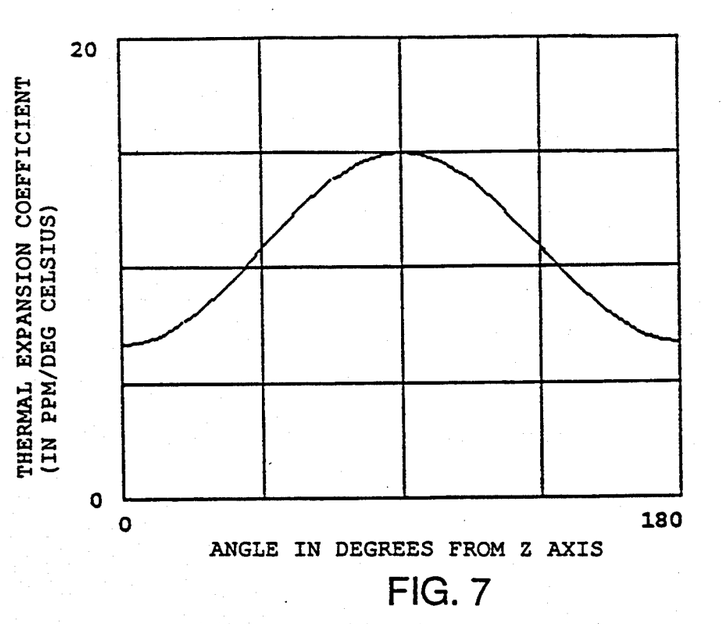
FIG. 7 is a graph of the thermal coefficient of expansion versus angle from the Z axis in the Y plane of a lithium niobate crystal.

FIG. 7 is a graph of the thermal coefficient of expansion versus angle $\theta$ from the Z axis in the Y plane of a lithium niobate crystal. The data of FIG. 7 are obtained by applying Eq. (4) to the thermal expansion coefficients (TABLE II) of lithium niobate using Euler angles 0, 90° and 90°+$\theta$.

Angle $\theta$ here describes an angle between a direction in which thermal expansion coefficients are being computed and the crystallographic Z axis. Various compositions of strontium calcium titanate based ceramics provide a thermal coefficient of expansion match to this orientation of lithium niobate at angles $\Phi$ (see FIGS. 1 and 3) ranging from about 35° to about 80° and about 100° to about 145°.

Epoxy/glass and polyimide/glass package base materials provide reduced thermal coefficient of expansion mismatch for angles $\Phi$ in the range from about 60° to about 120°, while epoxy/quartz and polyimide/quartz package base materials provide reduced thermal coefficient of expansion mismatch over angles $\Phi$ ranging from 0° to 60° and 120° to 180°.

Epoxy/aramid and polyimide/aramid package base materials provide reduced thermal coefficient of expansion mismatch for angle $\Phi$ ranging from 0° to about 60°. KOVAR ™ metal and Type 7052 glass provide least thermal coefficient of expansion mismatch for angles $\Phi$ near 0°.

Example III

Figure 8:
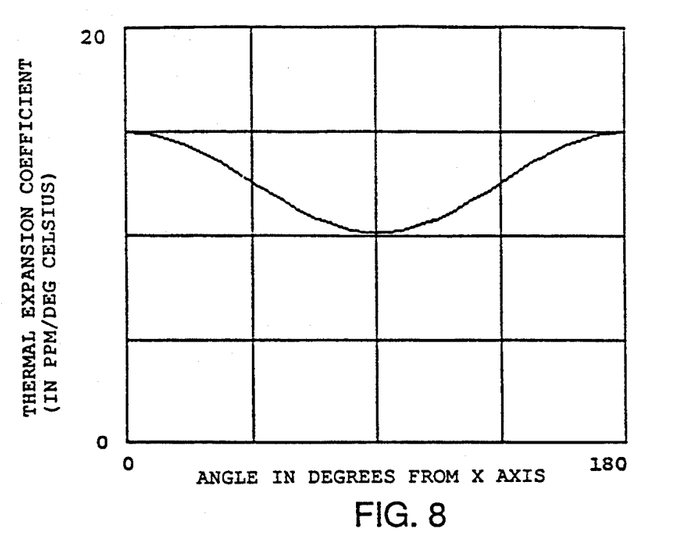
FIG. 8 is a graph of the thermal coefficient of expansion versus angle from the X axis in the plane of a 128°-Y-rotated lithium niobate crystal.

FIG. 8 is a graph of the thermal coefficient of expansion versus angle $\theta$ from the X axis in the plane of a 128°-Y-rotated lithium niobate crystal. The data of FIG. 8 are obtained by applying Eq. (4) to the thermal expansion coefficients (TABLE II) of lithium niobate using Euler angles of nominally 0, 127.86° and $\theta$.

Angle $\theta$ here describes an angle between a direction in which thermal expansion coefficients are being computed and the crystallographic X axis. Various compositions of strontium calcium titanate based ceramics provide a best thermal coefficient of expansion match to this orientation of lithium niobate at an angle $\Phi$ (see FIGS. 1 and 3) of substantially 90° to the X axis.

Epoxy/glass and polyimide/glass package base materials provide reduced thermal coefficient of expansion mismatch for angles $\Phi$ in the range from about 0° to about 50° and 130° to about 180°, while epoxy/quartz and polyimide/quartz package base materials provide reduced thermal coefficient of expansion mismatch over angles $\Phi$ ranging from 50° to 130°.

Epoxy/aramid and polyimide/aramid package base materials provide reduced thermal coefficient of expansion mismatch for angles $\Phi$ of about 90°. KOVAR ™ metal and Type 7052 glass provide least thermal coefficient of expansion mismatch for angles $\Phi$ near 90°.

Example IV

Figure 9:
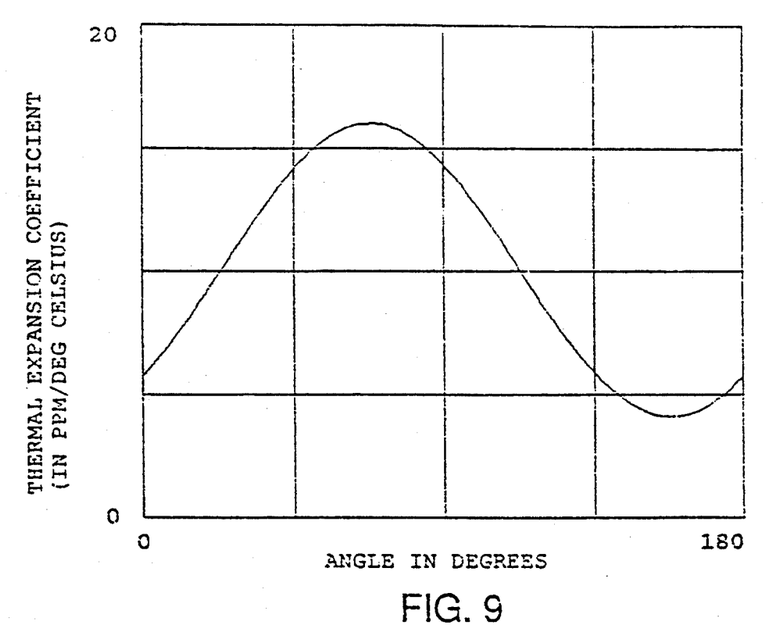
FIG. 9 is a graph of the thermal coefficient of expansion versus angle $\theta$ from the (Y-68°) axis in the plane of a 112°-rotated lithium tantalate crystal.

FIG. 9 is a graph of the thermal coefficient of expansion versus angle $\theta$ from the (Y-68°) axis in the plane of a 112°-rotated lithium tantalate crystal. The data of FIG. 9 are obtained by applying Eq. (4) to the thermal expansion coefficients (TABLE II) of lithium tantalate using Euler angles 90°, 90° and 112°+$\theta$. The maximum in the thermal coefficient of expansion values at 68° corresponds to the crystallographic Y axis while the minimum in the thermal coefficient of expansion values at 158° corresponds to the crystallographic Z axis.

Angle $\theta$ here describes an angle between a direction in which thermal expansion coefficients are being computed and the Y-68° axis in the X-Y plane. Various compositions of strontium-calcium-titanate based ceramics provide a best thermal coefficient of expansion match to this orientation of lithium tantalate at angles $\Phi$ (see FIGS. 1 and 3) substantially between 20° through 40° or 95° through 120° to the $\theta$=0° axis.

Epoxy/glass and polyimide/glass package base materials provide reduced thermal coefficient of expansion mismatch for angles $\Phi$ in the range from about 35° to about 125°, while epoxy/quartz and polyimide/quartz package base materials provide reduced thermal coefficient of expansion mismatch over angles $\Phi$ ranging from 15° to 40° and 95° to about 120°.

Epoxy/aramid and polyimide/aramid package base materials provide reduced thermal coefficient of expansion mismatch for angles $\Phi$ of in the range from 0° to about 25°. KOVAR ™ metal and Type 7052 glass provide least thermal coefficient of expansion mismatch for angles $\Phi$ near 140° and 170°.

The thermal coefficients of expansion are approximately matched between 112° rotated lithium tantalate and gallium arsenide (GaAs) at angles $\Phi$ of nominally about 0° and 135°.

Example V

Figure 10:
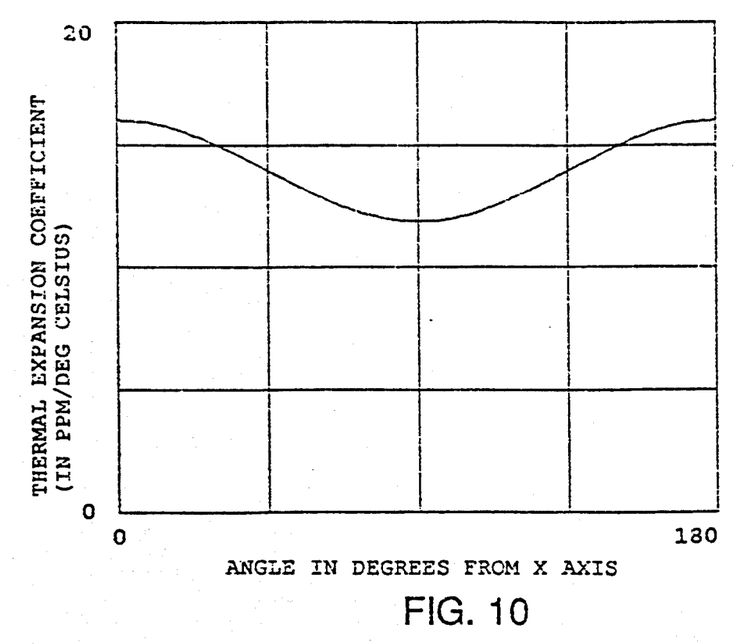
FIG. 10 is a graph of the thermal coefficient of expansion versus angle $\theta$ from the X axis in the plane of a 36°-rotated lithium tantalate crystal.

FIG. 10 is a graph of the thermal coefficient of expansion versus angle $\theta$ from the X axis in the plane of a 36°-rotated lithium tantalate crystal. The data of FIG. 10 are obtained by applying Eq. (4) to the thermal expansion coefficients (TABLE II) of lithium tantalate using Euler angles 0°, 36° and $\theta$. The maximum in the thermal coefficient of expansion values at 0° corresponds to the crystallographic X axis while the minimum in the thermal coefficient of expansion values is in the Y-Z plane.

Angle $\theta$ here describes an angle between a direction in which thermal expansion coefficients are being computed and the crystallographic X axis. Various compositions of strontium-calcium-titanate based ceramics provide a best thermal coefficient of expansion match to this orientation of lithium tantalate at an angle $\Phi$ (see FIGS. 1 and 3) of substantially 90° to the crystallographic X axis.

Epoxy/glass and polyimide/glass package base materials provide reduced thermal coefficient of expansion mismatch for angles $\Phi$ in the range from about 0° to 90°, while epoxy/quartz and polyimide/quartz package base materials provide reduced thermal coefficient of expansion mismatch at angles Φ of about 90°.

Epoxy/aramid and polyimide/aramid package base materials provide reduced thermal coefficient of expansion mismatch for angles Φ of about 90°. KOVAR TM metal and Type 7052 glass provide least thermal coefficient of expansion mismatch for angles Φ near 90°.

By orienting an adhesive along an axis of an anisotropic substrate material which axis is chosen to have a reduced thermal coefficient of expansion mismatch to an axis of a package base, thermally induced stresses in the package base and substrate are reduced. This provides for reduced mechanical stress in the packaged component. The reliability of both the adhesive attachment of the microelectronic device to the package base and the robustness of the assembled device in the package are improved by reducing thermally-induced stresses. Device performance changes resulting from temperature coefficient of expansion differences are also reduced by this approach.

APPLICATION

Figure 11:
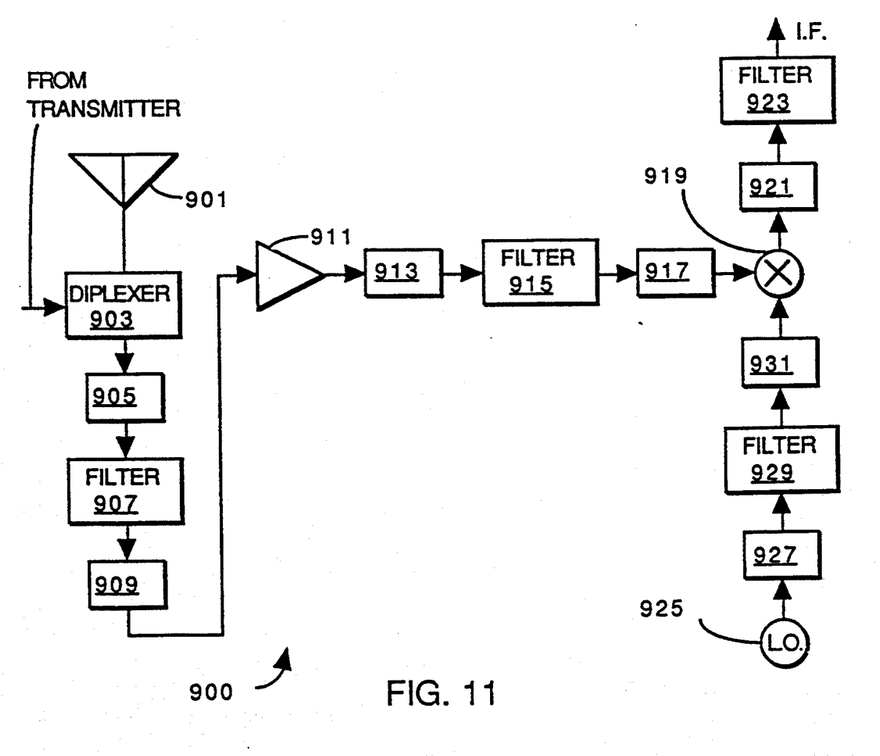
FIG. 11 is a block diagram of a portion of a radio frequency apparatus including a packaged acoustic wave filters in accordance with the present invention.

FIG. 11 is a block diagram of portion 900 of a radio frequency receiver or other radio frequency apparatus including packaged microelectronic devices in accordance with the present invention. Portion 900 includes antenna 901, by way of example, used to receive and/or transmit signals. Alternatively, antenna 901 may be replaced by a fiber-optic link or cable or other signal transmissive media.

Diplexer 903 is coupled to antenna 901 and to a transmitter portion (not shown). Diplexer 903 is a special purpose filter which couples received signals (but not much larger signals from an attached transmitter (not shown)) to filter 907 via optional matching circuit 905. Filter 907 is coupled to amplifier 911 via optional matching element 909. The output of amplifier 911 is transmitted to filter 915 via optional matching element 913. Filter 915 transmits its output to mixer 919 via optional matching element 917.

The signal from filter 915 is combined in mixer 919 with another signal coupled via filter 929 from local oscillator 925. Matching elements 927, 931 and 921 are optionally provided with filters 923 and 929. The output signal from mixer 919 is then filtered by filter 923 to provide the IF output signal. The arrangement of the present invention may be used to package any or all of SAW filters 903, 907, 915, 923 and 929 in accordance with the present invention.

Thus, a method and apparatus has been described which overcomes specific problems and accomplishes certain advantages relative to prior art methods and mechanisms. The improvements over known technology are significant.

By orienting an adhesive along an axis of an anisotropic substrate material which axis is chosen to have a reduced thermal coefficient of expansion mismatch to an axis of a package base, thermally induced stresses in the package base and substrate are reduced. This provides for reduced mechanical stress in the packaged component.

The reliability of both the adhesive attachment of the microelectronic device to the package base and the robustness of the assembled device in the package are improved by reducing thermally-induced stresses. Device performance changes resulting from temperature coefficient of expansion differences are also reduced by this approach.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

We claim:

1. An apparatus comprising:
   a substrate having anisotropic thermal expansion coefficients and a preferred axis, said substrate comprising a microelectronic device;
   a package base having an isotropic thermal expansion coefficient and a preferred direction, said package base for mounting said microelectronic device with said preferred axis substantially aligned to said preferred direction, said package base including external interconnections coupled to internal interconnections; and
   an adhesive for affixing said substrate to said package base, said adhesive disposed substantially only along a narrow line parallel to a first axis of said substrate, said first axis disposed at an angle Φ with respect to said preferred axis, wherein said first axis is chosen to provide an expansion coefficient of said substrate therealong providing a best match to said isotropic thermal expansion coefficient.

2. An apparatus as claimed in claim 1, further including a lid sealed to said package base by a seal.

3. An apparatus as claimed in claim 1, wherein:
   said substrate comprises one hundred and twelve degree rotated lithium tantalate and said preferred axis corresponds to a Y axis of said lithium tantalate;
   said package base comprises strontium calcium titanate ceramic material chosen to have a thermal expansion coefficient in a range of nine to thirteen parts per million per degree Celsius; and
   said first axis coincides with a line making said angle Φ in a range from about ninety five degrees to about one hundred and twenty degrees or about one hundred and seventy degrees to about two hundred degrees with said Y axis.

4. An apparatus as claimed in claim 1, wherein said adhesive comprises a member of a group consisting of polyetheretherketone, polysulfone, polyethersulfone, polyetherimide, polybutlyeneterepthalate and polycarbonate.

5. An apparatus as claimed in claim 1, wherein said substrate comprises quartz.

6. An apparatus as claimed in claim 1, wherein said substrate comprises lithium niobate.

7. An apparatus comprising:
   a substrate having anisotropic thermal expansion coefficients, said substrate comprising a microelectronic device having a preferred axis;
   a package base having an isotropic thermal expansion coefficient and a preferred direction, said package base for mounting said microelectronic device with said preferred axis substantially aligned to said preferred direction, said package base including external interconnects on coupled to internal interconnections;

an adhesive for affixing said substrate to said package base, said adhesive disposed substantially only along a narrow line along a first axis of said substrate, said first axis disposed at an angle Φ with respect to said preferred axis wherein an expansion coefficient of said substrate corresponding to said first axis provides a best match to said isotropic thermal expansion coefficient of said package base;

a seal; and a lid sealed to said package base by said seal.

8. An apparatus as claimed in claim 7, wherein said microelectronic device includes a surface acoustic wave device.

9. An apparatus as claimed in claim 7, wherein said substrate includes a member of a group consisting of silicon dioxide, lithium niobate and lithium tantalate.

10. An apparatus as claimed in claim 7, wherein said adhesive includes adhesive disposed as a series of dots arranged in a narrow line along said first axis, said substrate having a substantially similar thermal coefficient of expansion along said first axis as said isotropic thermal expansion coefficient.

11. An apparatus as claimed in claim 7, wherein said adhesive comprises a single narrow line of adhesive material disposed along said first axis, said substrate having a substantially similar thermal coefficient of expansion along said first axis as said isotropic thermal expansion coefficient.

12. An apparatus as claimed in claim 7, wherein:

said package base comprises alumina-bearing ceramic;

said substrate includes ST-cut quartz and said preferred axis corresponds to an X axis of said ST-cut quartz; and said first axis of said substrate coincides with a line making said angle Φ of four to twelve degrees with said X axis.

13. An apparatus as claimed in claim 7, wherein:

said package base comprises strontium calcium titanate ceramic having a thermal expansion coefficient in a range of nine to thirteen parts per million per degree Celsius;

said substrate includes Y-cut, Z-propagating lithium niobate and said preferred axis corresponds to a Z axis of said lithium niobate; and said first axis of said substrate coincides with a line making said angle Φ of thirty five to eighty degrees with said Z axis.

14. An apparatus as claimed in claim 7, wherein:

said package base comprises polyimide/quartz material chosen to have a thermal expansion coefficient in a range of eight to eleven parts per million per degree Celsius;

said substrate includes thirty-six degree rotated lithium tantalate and said preferred axis corresponds to an X axis of said lithium tantalate; and said first axis of said substrate coincides with a line making said angle Φ of about ninety degrees with said X axis.

15. A radio frequency apparatus including at least one microelectronic device comprising:

a substrate having anisotropic thermal expansion coefficients and a preferred axis, said substrate including said at least one microelectronic device;

a package base having an isotropic thermal expansion coefficient and a preferred direction, said package base for mounting said microelectronic device with said preferred axis substantially aligned to said preferred direction, said package base including external interconnections coupled to internal interconnections, said internal interconnections coupled to said microelectronic device;

an adhesive for affixing said substrate to said package base, said adhesive disposed substantially along a narrow line parallel to a first axis of said substrate, said first axis disposed at an angle Φ with respect to said preferred axis, wherein said first axis is chosen to provide a best match of an expansion coefficient corresponding to said first axis to said isotropic thermal expansion coefficient; and a lid hermetically sealed to said package base, said lid and said package base hermetically enclosing said microelectronic device.

16. A radio frequency apparatus as claimed in claim 15, wherein said microelectronic device comprises a surface acoustic wave device.

17. A radio frequency apparatus as claimed in claim 15, wherein said adhesive further comprises a single thin, narrow line of adhesive material disposed along said first axis, said substrate having a substantially similar coefficient of expansion along said first axis as said isotropic thermal expansion coefficient.

18. A radio frequency apparatus as claimed in claim 15, wherein:

said adhesive includes adhesive disposed as a series of dots arranged in a narrow line along said first axis; and said substrate has a substantially similar thermal coefficient of expansion along said first axis as said isotropic thermal expansion coefficient.

19. A radio frequency apparatus as claimed in claim 15, wherein:

said substrate comprises one hundred and twelve degree rotated lithium tantalate and said preferred axis corresponds to a Y axis of said lithium tantalate;

said package base comprises strontium calcium titanate ceramic material chosen to have a thermal expansion coefficient in a range of nine to thirteen parts per million per degree Celsius; and said first axis of said substrate coincides with a line making said angle Φ in a range from about ninety five degrees to about one hundred and twenty degrees or about one hundred and seventy degrees to about two hundred degrees with said Y axis of said lithium tantalate.

20. A radio frequency apparatus as claimed in claim 15, wherein said substrate comprises a member of a group consisting of lithium niobate, lithium tantalate and silicon dioxide.

* * * * *